United States Patent

Dix

[15] 3,693,239

[45] Sept. 26, 1972

[54] METHOD OF MAKING A MICROMODULAR PACKAGE

[72] Inventor: Sidney Dix, 2863 Ellesmere Ave., Costa Mesa, Calif. 92626

[22] Filed: July 25, 1969

[21] Appl. No.: 870,195

Related U.S. Application Data

[62] Division of Ser. No. 712,875, Nov. 28, 1967, Pat. No. 3,468,523.

[52] U.S. Cl. ..........................29/470, 29/588, 29/627
[51] Int. Cl. ..........................B23k
[58] Field of Search ..........228/46; 29/470, 588, 627; 174/DIG. 3, 52 S

[56] References Cited

UNITED STATES PATENTS

| | | | |
|---|---|---|---|
| 2,994,121 | 8/1961 | Shockley | 29/577 |
| 3,112,389 | 11/1963 | Wiant | 228/46 |
| 3,151,591 | 10/1964 | Burns et al | 228/44 |
| 3,155,766 | 11/1964 | Eichert et al. | 174/52 |
| 3,217,088 | 11/1965 | Steierman | 174/52 |
| 3,217,213 | 11/1965 | Slater | 174/52 X |
| 3,271,625 | 9/1966 | Caracciolo | 317/101 |
| 3,312,540 | 4/1967 | Plumbo et al | 174/52 |
| 3,404,213 | 10/1968 | Brookover et al. | 174/52 |
| 3,203,083 | 8/1965 | Obenhaus | 29/588 X |

*Primary Examiner*—John F. Campbell
*Assistant Examiner*—Richard Bernard Lazarus
*Attorney*—Smyth, Roston & Pavitt

[57] ABSTRACT

Disclosed is a method of making micromodular packages having a housing enclosing a space containing a plurality of electrical components. The method includes the steps of forming a base with a side wall extending therearound to at least partially define a space, providing a metal rim on the side wall, placing electrical components in the space, placing a cover having a metal frame on the side wall such that the metal frame rests on the metal rim and soldering the frame to the rim while maintaining the temperature of the electrical components below a predetermined level.

5 Claims, 2 Drawing Figures

Figure 2:
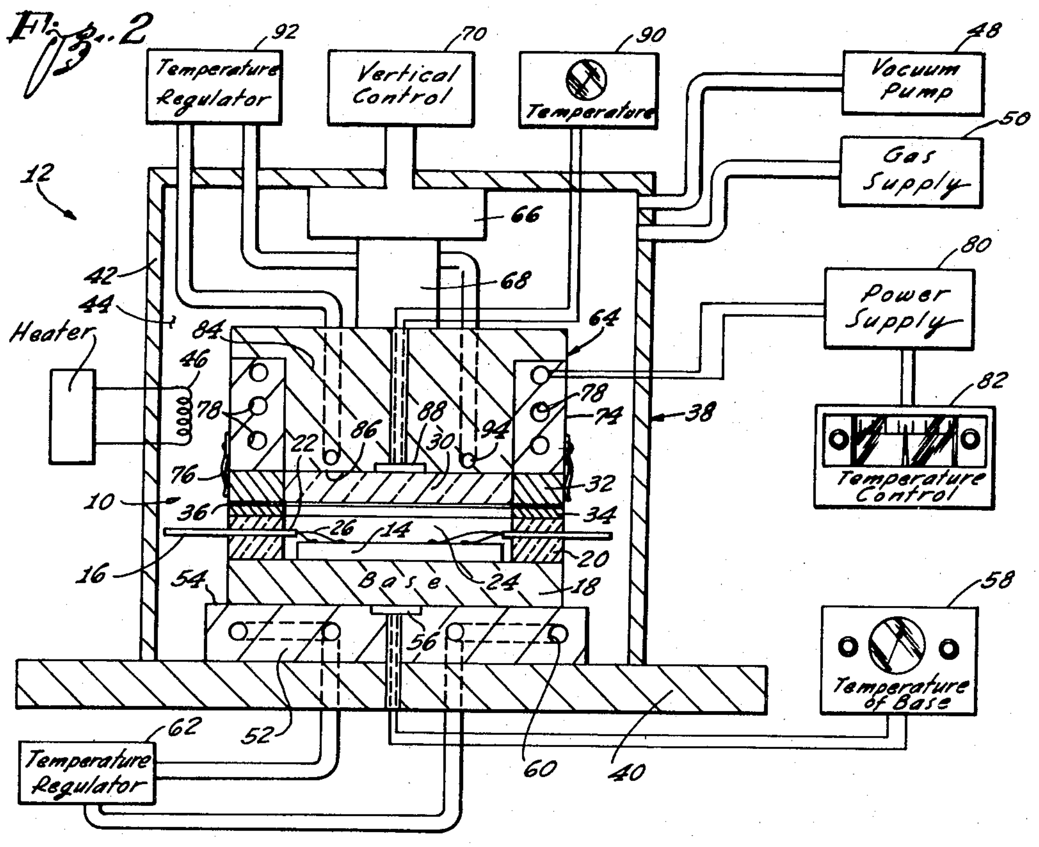

INVENTOR:
Sydney Dix
By Smyth, Roston & Pavitt
Attorneys

METHOD OF MAKING A MICROMODULAR PACKAGE

This is a division of Ser. No. 712,875 filed Nov. 28, 1967 now U.S. Pat. No. 3,468,523.

The present invention relates to electronic devices, and more particularly to means for packaging electronic devices.

At the present time, there are a large number of electronic components such as semiconductive devices like transistors and diodes which are very compact and occupy an extremely small volume. However, such devices are of very delicate nature and must be enclosed in a suitable housing in order to protect them from the environment. As a consequence, the overall bulk, size and weight is greatly increased. In fact, in some types of semiconductive devices, the device per se is of negligible size and weight while the package thereof represents a major portion of the overall weight and bulk of the fully assembled component.

In order to use the semiconductive devices in electrical circuits, it is necessary to interconnect the devices with other components similar to semiconductive devices. The interconnection by means of wires, etc., further increases the size and weight many fold over the actual size and weight of the components. To reduce the size and weight of the circuit, it has been proposed to employ a wafer of a semiconductive material such as silicon and "lay down" a plurality of components in the various regions of the wafer so as to form an integrated circuit or module.

This is very effective to reduce the overall size and weight of the circuit or module. The wafer having the various components therein may then be enclosed in a small package so as to form a so-called micromodular package containing an integrated circuit. Since the semiconductive wafer is of a delicate nature and is adversely affected by moisture, various contaminating materials, light, etc., the entire wafer must be enclosed in an hermetically sealed package. In order to hermetically seal the package after the semiconductive wafer is placed therein, it is necessary to raise the temperature of the package to cause the fusing or molecular bonding of the various parts together. Heretofore this has been accomplished by installing the semiconductive wafer in one portion of the package. A second portion or cover is then placed upon the first portion and the entire package is placed in an oven and heated to a sufficient temperature to cause the various parts of the package to be bonded into an hermetically sealed unit. Unfortunately, the various components such as a semiconductive wafer are sensitive to heat. If the temperature of the wafer exceeds a critical amount, its electrical characteristics will be permanently altered or completely destroyed. By a proper choice of materials such as the use of low melting solders, it is possible to produce an hermetic seal by employing temperatures which are slightly below the critical temperatures that will damage semiconductive wafers. Unfortunately, the temperature at which solder melts is very close to the critical temperature for the semiconductive wafer. As a consequence, the temperature to which the micromodular package is heated during the bonding operation must be accurately controlled within a very narrow range. If the micromodular package is heated even slightly beyond this range, the characteristics of one or more of the components formed by the various regions of the wafer will be permanently altered. On the other hand, if the temperature of the micromodular package is not raised to a sufficient level to fall within the range, a perfect seal will not be formed. The resultant micromodular package will then be a so-called "leaker" and will be defective or will prematurely fail. As a consequence, heretofore when packaging semiconductive wafers having integrated circuits, an extremely large number of the resultant micromodular packages have been defective and of unacceptable quality.

It has also been found that in the process of installing the semiconductive wafer in the package, electrically interconnecting it and sealing the resultant micromodular packages, occasionally contaminating foreign matter and objects enter the package and become sealed therein. This will materially and adversely affect the operating characteristics of the circuit contained within the micromodular package. A loose piece of material such as a loose piece of solder may not affect the operation of the circuit until it moves into a critical position. As a consequence, it is impossible to detect the presence of such latent defects at the time of packaging by an electrical inspection of the finished product. Thus, although the package may be successfully tested, at some future and unpredictable time a foreign object such as a loose piece of solder, etc., may move around within the package so as to cause a malfunction or failure of the micromodular package.

It is now proposed to provide means for overcoming the foregoing difficulties. More particularly, means are provided whereby an integrated electrical circuit may be reliably hermetically sealed in a micromodular package without damaging or altering the characteristics of any portions of the circuit. In addition, means are provided for inspecting a sealed micromodular package for latent physical defects sealed inside of the package. More particularly, it is proposed to provide a micromodular package having a first portion into which the integrated semiconductive circuit is installed and having a second or cover position that may be bonded to the first portion to hermetically seal the integrated circuit therein.

The cover portion includes a transparent window section that will permit optically viewing the circuit and its environment after it has been sealed inside of the package whereby any latent defects may be observed. In addition, a new and novel sealing machine and method are provided for hermetically sealing the cover portion to the first portion without unduly raising the temperature of the semiconductive wafer being sealed inside of the micromodular package. As a consequence, the temperature of the junction between the cover and the rest of the housing may be raised to a sufficiently high level to insure a positive and reliable sealing of each package. However, during the sealing operation, the temperature of the various components contained within the housing will be maintained sufficiently below their critical level to eliminate the possibility of any of their electrical characteristics being adversely affected or altered.

Figure 1:
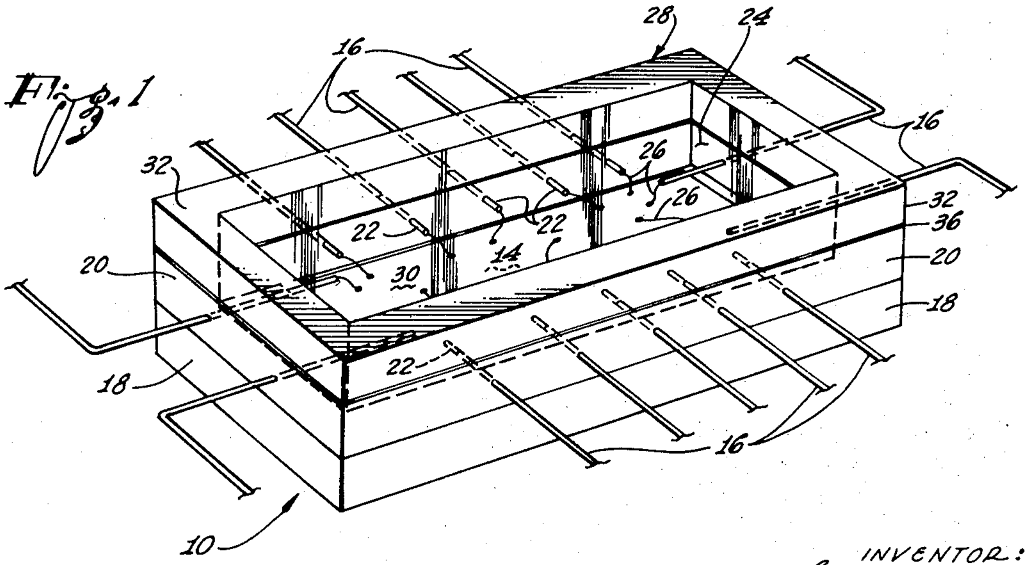

These and other features and advantages of the present invention will become readily apparent from the following detailed description of one embodiment thereof, particularly when taken in connection with the accompanying drawings, wherein like reference numerals refer to like parts, and wherein:

FIG. 1 is a perspective view of a micromodular package embodying one form of the present invention and hermetically enclosing an integrated electrical circuit having one or more electrical components therein, and FIG. 2 is a transverse cross-sectional view of a sealing machine and method embodying the present invention and particularly adapted for sealing micromodular packages of the type shown in FIG. 1.

Referring to the drawings in more detail, the present invention is particularly adapted to be embodied in a micromodular package 10 for hermetically sealing integrated circuits employing one or more electrical components such as semiconductive devices and to be embodied in a sealing machine 12 and method for sealing micromodular packages 10.

The micromodular package 10 may be of any desired form and shape; in the present instance it is shown as a small rectangular package that is relatively flat. The package 10 is particularly adapted to enclose and to hermetically seal an integrated circuit containing several different components. The integrated circuit may be a complete structure. However, it is normally a part or module of a more comprehensive structure.

The components included within the circuit may be of any desired variety, for example, active components such as diodes, transistors, etc., or passive components such as resistances, capacitances, inductances, etc. The components contained in the micromodular package 10 may be a plurality of separate units that can be interconnected to form the circuit. However, it has been found desirable to provide a wafer 14 that forms a common substrate for all of the various components. As a consequence, all of the components and circuitry will be embodied in a single monolithic structure.

Normally, the wafer 14 will include a silicon material. However, the wafer 14 may include gallium arsenite, germanium, or any other material which exhibits suitable semiconductive properties. The various components which are employed in the circuit are "laid down" on the wafer 14 by any suitable means which are well known in the art. This will result in the wafer 14 having various zones or regions which possess semiconductive barriers. Each of these barriers will be effective to provide the desired electrical characteristics for the various components to be included in the circuit.

The various regions formed in the wafer 14 may then be electrically interconnected with the other regions and/or with external components so as to form a completely integrated circuit.

After the wafer 14 has been completely formed, it may be disposed in a micromodular package which is hermetically sealed to protect the components within the circuit from contamination from the surrounding environment. The specific size, shape and design of the micromodular package 10 will vary with the particular application and the configuration of the circuit. However, by way of example, the overall or outside dimensions of the package 10 may be on the order of about one-fourth of an inch long by about one-eighth of an inch wide by about one-sixteenth of an inch or less thick. Various regions of the wafer 14 which form the components may be interconnected with electrical leads 16 which extend from the outside of the package 10 so as to permit them to be interconnected with external circuitry.

The electrical leads 16 may be arranged in any desired pattern. However, in the present instance they are shown as being arranged in a somewhat standard configuration which consists of five electrical leads 16 extending from each side of the package 10 and two leads 16 extending from each end of the package 10. These leads 16 are arranged so that there will be seven leads extending laterally from each side of the package 10 substantially parallel to each other and at substantially uniformly spaced intervals.

Referring to the drawings in greater detail, the present micromodular package 10 includes a base 18 that forms the bottom of the micromodular package 10 as seen in FIGS. 1 and 2. This base 18 will normally have a length and width which correspond respectively to the length and width of the finished micromodular package 10. The thickness of the base 18 will normally be just sufficient to insure its having a structural rigidity which will prevent its being damaged during normal usage and to insure the base 18 being impervious to the environment in which the package 10 will be used. Although the base 18 may consist of any desired material, it has been found that materials such as metal, glass or ceramic are particularly well suited for this type of construction.

A side wall 20 is provided around the entire periphery of the base 18. This side wall 20 may be formed integral with the base 18 or as in the present embodiment it may be a separate member. Normally, the side wall 20 will consist of a dielectric or electrical non-conductive material such as ceramic or glass. The side wall 20 is a single monolithic structure that does not have any openings therein. The exterior surface of the side wall 20 is substantially aligned with the edge of the base 18. The interior of the side wall 20 is positioned to coact with the inner surface of the base 18 to at least partially define an open space 24. This space 24 should be of sufficient size to permit the wafer 14 containing the components to be placed within the side wall 20 and adjacent the base 18. In addition, the wall 20 should have a height which is in excess of the thickness of the wafer 14. As a result when the wafer 14 is properly positioned, the side wall 20 will extend slightly above the wafer 14.

In order to permit interconnecting the components formed by the various regions of the wafer 14 with external circuitry, the electrical leads 16 are provided. These leads 16 are disposed in the side wall 20 so that the inner ends 22 of the leads 16 will project a short distance into the space 24 at approximately uniformly spaced intervals. The outer ends of the leads 16 extend from the side walls 20 in any desired pattern such as the pattern described above. The side wall 20 will consist of a dielectric or electrically nonconductive material such as a ceramic. Accordingly, the leads 16 may be embedded in the ceramic material at the time the side wall 20 is formed and placed around the periphery of the base 18.

After the side wall 20 is formed on base 18 and the leads 16 are positioned in the side walls 20, the resultant sub-assembly may be heated to a sufficient temperature to vitrify the side wall 20 and fuse it to the leads 16 and the periphery of the base 18.

It should be noted that since the base 18 and leads 16 are relatively insensitive to the heat, the temperature of the sub-assembly may be raised to a sufficient high level to insure a positive and complete fusing of the material in the side wall 20 to the leads 16 and base 18. As a consequence, the sub-assembly will be converted into an integral structure that will be imperforate and free from any leaks.

After the foregoing structure has been provided, the semiconductive wafer 14 may be placed adjacent the base 18 and in the space 24 formed by the side wall 20. This wafer 14 will then be partially surrounded by the base 18 and side wall 20. The various regions within the wafer 14 that form the components may then be interconnected with the inner ends 22 of the electrical leads 16 by suitable electrically conductive means. This may be accomplished by means by a plurality of small wires 26 which are soldered or other wise secured between the inner ends of the leads and the various regions of the wafer. Alternatively, it may be accomplished by providing a mask over the wafer and depositing an electrically conductive film through various openings in the mask that register with the regions and inner ends. This will result in electrically conductive paths being formed between the various regions of the wafer and the inner ends of the conductors.

It will thus be seen that the various components formed by the various regions of the wafer 14 will now be electrically interconnected with each other and the inner ends 22 of the electrical leads 16. As a consequence, the electrical circuit or circuits formed on the wafer 14 may be interconnected with suitable external circuitry.

In order to protect the wafer 14 and prevent contamination thereof, etc., a suitable cover 28 may be secured to the side wall 20 so as to complete a hermetically sealed micromodular package 10 containing the wafer 14. This cover 28 may be of any desired variety and may be secured to the side wall 20 by any suitable means. In the present instance, this cover 28 includes a center portion 30 having a high thermal resistance and a frame 32 that extend around the periphery of the center portion 30.

The frame 32 may consist of any desired material which can be bonded to the portion 30 . The frame 32 is preferably a metal having thermal characteristics substantially identical to the characteristics of the portion 30. By way of example, it has been found that Kovar is particularly well suited for this application if the portion 30 is a glass.

The frame 32 may be a relatively thin member having a rectangular shape substantially identical to the shape of the side wall 20. As a consequence, the frame 32 may be positioned to register with the upper edge of the side wall 20.

The center portion 30 preferably consists of a material having a high thermal resistance so that a minimum quantity of heat may flow from the frame 32 to the portion. In addition, the portion 30 may be optically transparent to visible light. As a consequence, the center portion will form a window 30 through which a person may look.

Normally, the cover 28 will be formed by inserting the transparent portion or window 30 into the opening formed in the center of the frame 32. The periphery of the window 30 will then bear against the inside of the frame 32 in intimate contact therewith and form a second sub-assembly. This sub-assembly may then be placed in a suitable furnace and heated to a sufficient temperature to cause the window 30 to be fused onto the metal frame 32. Since this sub-assembly can be heated to very high temperatures without damage, it will be possible to raise the temperature to insure a perfect hermetic seal always being formed between the frame and window.

After the cover 28 has been formed, it may be placed upon the top of the side wall 20 and secured thereto by means of a suitable hermetic seal. This will insure the space 24 formed inside of the micromodular package 10 being hermetically separated from the surrounding environment.

Although there are numerous suitable means by which the frame 32 of the cover 28 may be attached to the side wall 20, in the present instance it is accomplished by means of a soldered Junction. In order to facilitate soldering the cover 28 in position, a metal rim 34 may be provided on the top of the side wall 20. If the metal rim 34 is employed, it is placed upon the top of the side wall 20 at the time the side wall 20 is formed. When the side wall 20 is heated so as to be fused onto the leads 16 and base 18, it will also be fused on to the rim 34 by means of a hermetic seal.

The frame 32 extending around the cover 28 and the rim 34 extending around the top of the side wall 20 preferably have substantially the same rectangular shapes. Thus, when the frame 32 is seated on the rim 34, they will register substantially perfectly with each other.

To solder the frame 32 to the rim 34, a solder preform 36 may first be placed on the rim 34. The preform 36 will have substantially the same rectangular shape as the rim 34 and will extend completely therearound. The cover 28 is then placed in position so that the frame 32 will rest on the preform 36. Following this, a sufficient amount of heat is applied to cause the solder in the preform 36 to melt and flow along the surfaces of the rim 34 and frame 32. When the package 10 cools and the solder solidifies, the rim 34 and frame 32 will be hermetically sealed together whereby the micromodular package 10 is completely hermetically sealed with the wafer 14 disposed inside of the space 24. The wafer 14 and the connecting conductors 26 will be visible through the window 30 for a visual inspection.

In order to insure each and every soldering operation providing a perfect hermetic seal, it is necessary for the solder to be completely melted and the rim 34 and frame 32 being hot enough to insure the molten solder flowing freely therealong. Normally, this requires that the temperature be above a minimum of about 200°. However, if the semiconductive wafer 14 is heated to a temperature of about 450°, the various components will be destroyed or at least their characteristics will be permanently altered.

It can be seen that the foregoing temperatures are very close together and that there is very little margin for error in melting the temperature of the solder. As a consequence, heretofore in the process of sealing modular packages a substantial portion of the semiconductive wafers have been destroyed or altered as a result of the temperature being too high. Also, a substantial portion of the packages 10 have been so-called "leakers" because of an imperfect hermetic seal resulting from the solder 36, rim 34 and/or frame 32 not being heated to a sufficient temperature to insure a complete soldering.

Although the micromodular package 10 may be assembled by any suitable means, it has been found that the foregoing difficulties can be overcome by securing the cover in position by employing the sealing machine 12 and method shown in FIG. 1. The sealing machine 12 includes a housing 38 having a bottom 40 and a cover 42. The cover 42 is secured to the bottom 40 by an air tight seal whereby the housing 38 will enclose a chamber 44.

The atmosphere within this chamber 44 may be controlled in several respects. First of all, a heating element 46 is provided inside of the housing 38 so that the temperature of the atmosphere and the contents in the chamber 44 may be set at any desired level. In addition, a vacuum pump 48 is interconnected with the chamber 44 so that the atmosphere can be removed and the pressure in the chamber 44 can be reduced to any desired level. A gas supply 50 may also be provided for feeding a gas of some particular composition. This gas may be of a type that is inert and free of substances that might contaminate a semiconductive wafer 14. By way of example, this gas may be a clean, dry nitrogen.

A support 52 may be provided on the bottom 40 of the housing 38. The top of this support 52 provides a substantially horizontal work surface 54. This surface 54 is particularly adapted to have the base 18 of the package 10 seated thereon.

The support 52 preferably includes a material having a high thermal conductivity whereby the support will act as a heat sink. As a consequence, the support or heat sink 52 will be effective to absorb a large quantity of heat from the base 18 and limit the maximum temperature of the base 18.

In order to facilitate this control and to increase the accuracy thereof, a thermal couple 56 or similar device may be provided in the work surface 54 so as to engage the bottom of the base 18. The thermal couple 56 is interconnected with a temperature indicator 58. Thus, the temperature of the base 18 may be observed from the indicator 58.

In addition, a plurality of temperature control elements 60 may be disposed in the heat sink 52 immediately below the surface 54. These elements 60 may be interconnected with a temperature regulator 62. The regulator 62 will be effective to control the flow of a medium such as a gas or liquid whereby the temperature at the elements 60 will be precisely determined.

In order to position the cover 28 on the micromodular package 10, a ram 64 may be secured to the top of the housing 38. The ram 64 is supported by means of a device such as a cylinder 66 and piston 68 that can move the ram 64 vertically in response to the vertical control 70.

The ram 64 includes a heater 72 that has a cross-sectional shape that is substantially the same as the frame 32. As a consequence, the frame 32 may be placed on the bottom of the heater 72 in intimate heat exchanging relation. Fastening means such as spring clips 76 may be provided on the heater 72 so as to grip the exterior of the frame 32.

The heater 72 may include a heater element 78 such as a resistive wire that can be heated by an electrical current The element 78 is interconnected with a suitable power supply 80. The power supply 80 is, in turn, controlled by means of a temperature control 82. It may be seen that by properly setting the control 82, an electrical current may be fed through the heating element 78 and the temperature of the frame 32 raised to any required level.

Normally, the center portion 30 of the cover 28 possess a high thermal resistance. As a consequence, if the frame 32 is heated for only a short interval, the temperature of the center portion 30 will not rise sufficiently to cause a material amount of heat to be transferred into the wafer 14. However, in order to provide a more positive control over this temperature, a heat sink 84 may be provided in the ram 64. The heat sink 84 includes a substantially plane surface 86 that includes a substantially plane surface 86 that will come into intimate contact with the window portion 30 and absorb heat therefrom.

A thermal couple 88 or similar device may be disposed in the heat sink 84 so as to sense the temperature of the window 30. This temperature will be indicated on the dial 90. A temperature regulator 92 may be interconnected with a temperature control element 94 in the heat sink 84. The regulator 92 will be effective to cause a cooling medium to flow through the element 94 and precisely control the temperature of the surface 86 and the window 30.

In order to produce an integrated electrical circuit hermetically sealed within a micromodular package 10, the base 18 and side wall 20 are first assembled. The base 18 may be of any desired material such as a metal or a ceramic while the side wall 20 will normally be of a dielectric or non-conductive material such as glass or ceramic. At the time the side wall 20 is formed on the base member 18, the electrical leads 16 are positioned so as to extend through the side wall 20. The inner ends 22 of the leads 16 will be disposed in the space 24 immediately adjacent the side wall 20 while the rest of the leads 16 will extend laterally from the opposite sides. The rim 34 is then placed on the top of the side wall 20 substantially parallel to the base 18.

The subassembly is then placed in a furnace and the temperature of the entire subassembly raised to a sufficient level to vitrify the side wall 20 and to hermetically seal the rim 34, the leads 16 and the base 18 into a single integral structure. Since the various components of this structure can withstand very high temperatures, it is possible to heat the structure to a sufficient level to insure a complete vitrifying of the side wall 20 and the formation of perfect hermetic seals between the base 18, the side wall 20, the leads 16 and the rim 34.

At approximately the same time the cover 28 may be prepared. Normally, this will be accomplished by first inserting the center portion or transparent window 30 into the opening in the center of the frame 32. This subassembly may then be placed in a furnace and heated to a sufficient temperature to cause the material in the window 30 to fuse onto the frame 32 and form an hermetic seal therebetween. It should be noted that the window 30 and frame 32 may be heated to extreme temperatures without causing any damage. Accordingly, it will be possible to heat the structure to a sufficient temperature to always insure a perfect bonding of the transparent window 30 to the frame 32.

After the foregoing subassemblies have been prepared a semiconductive wafer 14 having the desired electrical characteristics may be inserted into the space formed by the side wall 20. The various regions and/or components in the wafer 14 may be interconnected with the inner ends 22 of the leads 16. Normally, this is accomplished by soldering wires 26 to the wafer 14 and the inner ends 22 of the electrical leads 16.

The structure with the semiconductive wafer 14 mounted therein may then be inserted into the chamber 44 in the sealing apparatus 12 so that the base 18 will rest on the work surface 54 formed by the heat sink 50. The solder preform 36 is placed on the rim 34 so as to be aligned therewith. At about the same time, the cover 28 may be secured to the bottom of the ram 64. The spring clips 76 will retain the frame 32 in intimate contact with the heater 72. Also, the transparent window 30 will be maintained in intimate contact with the heat exchanging surface 86 formed by the heat sink 84.

The chamber 44 may be closed and the heater 46 energized. The heater 46 will be effective to raise the temperature of the chamber 44 in the sealing apparatus 12 and the micromodular package 10 therein. The temperature is normally raised to a region on the order of about 200°. This will be sufficient to cause annealing and/or to cause any gases, etc., trapped in or on any portions of the various portions of the package 10 and wafer 14 to be driven therefrom and into the atmosphere. The temperature range required for this operation is far removed from the critical temperature at which the electrical characteristics of the semiconductive wafer 14 are altered.

At or about the same time the foregoing heating operation is occurring, the vacuum pump 48 may be energized so as to remove the atmosphere from the chamber 44. At the completion of the pumping operation, the gas supply 50 may be interconnected with the chamber 44. This will cause a non-contaminating gas such as dry nitrogen to flow into the chamber 44.

This purging process may be continued until all of the gases, etc., entrapped in the base 18, side wall 20, wafer 14, cover 28, etc., have been emitted into the atmosphere and the atmosphere in the chamber 44 is free of any contaminating gases or other substances. At the completion of the purging operation, the vacuum pump 48 may be stopped and the atmosphere within the chamber 44 stabilized at some predetermined pressure and temperature.

It should be noted that during the purging operation, the piston 68 will maintain the ram 64, and the cover 28 secured thereto, in an elevated position. This will open the space 24 inside of the lower structure and particularly in the region of the semiconductive wafer 14 to the atmosphere in the chamber 44. Thus, the space 24 around the wafer 14 will also be purged of any contaminating gases, etc.

The control 70 may now be energized so as to move the ram 64 downwardly. This will lower the cover 28 and move the frame 32 against the solder preform 36 seated on the rim 34. The temperature control is set to a temperature that is sufficiently high to always insure the complete melting of the solder and its flowing around the rim 34 and the frame 32. The power supply 80 is then turned on so as to energize the heater 74. This will raise the temperature of the heater element 78 and cause substantial quantities of heat to flow from the heater 74 into and through the frame 32. At least a portion of this heat will pass through the solder preform 36 and into the rim 34. The temperatures of the frame 32, rim 34 and preform 36 will be raised above the melting point of the solder. The solder preform 36 will thereby be melted and flow into intimate contact with the mating surfaces of both the frame 32 and the rim 34. As a consequence, when the heater 72 is de-energized and the temperatures of the frame 32 and rim 34 decrease, the solder will solidify and solder the frame 32 and rim 34 together by means of an imperforate hermetic seal.

It should be noted that during the foregoing heating operation some of the heat will tend to flow into the transparent window 30 and through the side wall 20. Since the window 30 has a high thermal resistance, a relatively small portion of the heat will be carried into the window 30. As a consequence, during the relatively short time interval required for the soldering, the temperature of the window 30 normally will not rise to a sufficient degree to cause any thermal damage to the semiconductive wafer 14. However, under some circumstances, it may be desirable to control the temperature of the window 30. In order to accomplish this, the surface 86 of the heat sink 84 is maintained in intimate heat exchanging contact with the window 30.

If it is desirable to provide further regulation over the temperature, the temperature regulator 92 may be set so as to cause a temperature controlling medium to circulate through the element 94. This will be effective to very precisely maintain the temperature of the window 30 prior to and during the soldering operation at a safe level. The temperature of the window 30 may be observed on the temperature indicator 90.

A substantial amount of the heat transferred into the rim 34 will flow into the side wall 20. A portion of the heat will enter into the leads 16 and be carried therethrough so as to be dissipated. However, a very substantial portion of the heat will flow into the base 18 and be carried therealong. If the base 18 consists of a ceramic material, the high thermal resistance will greatly limit the rise of the base temperature and the amount of heat reaching the semiconductive wafer 14. In order to further limit the temperature rise, the base 18 is maintained in intimate contact with the work surface 54. Thus, any excessive quantities of heat will be transferred into the heat sink 52. In order to provide a precise control over this flow, the temperature control 58 may be set to cause a suitable medium to flow through elements 60 and limit the temperature of the surface 54 to an exact amount. The temperature of the base 18 may be monitored on the indicator 58.

It will thus be seen that a sealing apparatus 12 has been provided that will be effective to raise the temperatures of the frame 32, rim 34 and solder preform 36 to a level that is more than adequate to insure a complete and perfect soldering. However, the amount of heat transferred to the semiconductive wafer 14 will be reduced to a very small amount. This in turn will be effective to prevent the temperature of the semiconductive wafer 14 ever rising into a range which will endanger the characteristics of the wafer 14.

After the cover 28 has been properly soldered to the side wall 20, the temperature of the micromodular package 10 may be reduced so that the package 10 may be deteched from the heater 72 and removed from the sealing apparatus 12. The space 24 inside of the package 10 and surrounding the semiconductive wafer 14 will now be hermetically sealed so as to protect the wafer 14 from its environment. In addition, the atmosphere in the space 24 and in intimate contact with the semiconductive wafer 14 will be carefully controlled and free of any substance that might contaminate the semiconductive wafer 14.

The completed micromodular package 10 will normally be inspected to insure its being a satisfactory unit. This may be accomplished by supplying suitable signals to the various electrical leads 16. This will be effective to determine whether or not the resultant package 10 has the desired electrical characteristics.

In addition, a visual inspection may be made of the space 24 inside the package 10 and particularly the semiconductive wafer 14 and the interconnections therewith. This is accomplished by looking through the transparent window 30 by means of a suitable magnifying glass. In the event there are any loose particles such as solder, spatter, etc., they will be readily detected even though they do not at that time affect the electrical characteristics of the micromodular package 10. In the event the semiconductive wafer 14 is sensitive to light after it has been visually inspected, the window 30 may be coated with a suitable opaque film to prevent light entering in to the space.

While only a single embodiment of the present invention is disclosed herein, it will be readily apparent to persons skilled in the art that numerous changes and modifications may be made thereto without departing from the scope of the invention. Accordingly, the foregoing disclosure and description thereof are for illustrative purposes only and do not in any way limit the invention which is defined only by the claims which follow.

What is claimed is:

1. The method of making a micromodular package having a housing enclosing a space containing a plurality of electrical components, said method including the steps of:

forming a base with a side wall extending therearound to at least partially define a space, providing a metal rim on said side wall so as to surround said space, placing said electrical components in said space, placing a cover having a metal frame on said side walls so that the metal frame will rest on the metal rim, providing solder and soldering said frame to said rim by heating said frame to between 200°C and 400°C, and maintaining the temperature of said base below a predetermined level during the interval said frame is soldered to said rim so as to maintain the temperature of said components below a predetermined temperature.

2. The method of making a micromodular package having a housing enclosing a space containing a plurality of electrical components, said method including the steps of:

forming a base with a side wall extending therearound to at least partially define a space, providing a metal rim on said side wall so as to surround said space, placing said electrical components in said space, placing a solder preform on said rim, placing a cover having a metal frame on said side walls so that the metal frame will rest on the solder preform, soldering said frame to said rim by heating said frame to a temperature between 200°C and 400°C until said solder melts and flows between the rim and frame, and maintaining the temperature of said base and the center of said cover below a predetermined level while said solder is being melted to thereby maintain the temperature of said components below said critical temperature.

3. The method of making a micromodular package having a housing enclosing a space containing a plurality of electrical components, said method including the steps of:

forming a first portion of the housing having a base and an integral side wall extending therearound so as to at least partially define said space, providing a metal rim on said side wall, providing a plurality of electrical leads through the side walls with the inner ends of the leads being disposed in said space, forming a second portion of the housing including a cover having a transparent center pane and a metal frame extending around the periphery of the pane, positioning an electrical circuit in the space and interconnecting the circuit with the inner ends of said leads, preheating the first and second portions to an intermediate temperature that will drive gases therefrom, placing said cover on the first portion with said frame resting on said metal rim and said transparent pane being disposed over said space, providing solder and applying heat to said frame so as to raise the temperature of said frame and the portion of the side wall adjacent the frame to between 200°C and 400°C to cause the solder to flow and to hermetically bond said frame to said side walls.

4. The method of making a micromodular package having a housing enclosing a space containing a plurality of electrical components, said method including the steps of:

forming a first portion of the housing having a base and an integral side wall extending therearound so as to at least partially define said space, providing a metal rim around said side wall so as to surround said space, providing a plurality of electrical leads through the side walls with the inner ends of the leads being disposed in said space, forming a second portion of the housing including a cover having a transparent center pane and a metal frame extending around the periphery of the pane, positioning an electrical circuit in the space and interconnecting the circuit with the inner ends of said leads, placing a solder preform on said rim, placing said cover on said side walls with said frame resting on said solder preform with the transparent pane being disposed over said space and aligned with said circuit, applying heat to said fame so as to raise the temperature of said frame, rim and the solder preform to a temperature between 200°C and 400°C wherein until the solder melts and flows between the frame and rim so as to solder the frame to the rim, and visually inspecting the circuit sealed in said space by viewing through the transparent pane.

5. The method of making a micromodular semiconductor package containing a plurality of semiconductive devices interconnected in an electrical circuitry, said method including the steps of:

1 forming a first integral structure having a substantially plane base and a side wall that extends around the periphery of said base and at least partially defining a space, providing a plurality of electrical leads through the side walls with the inner ends of the leads being disposed in said space, providing a substantially planar metal rim on said side that surrounds the space, positioning an electrical circuit in the space and interconnecting the circuit with the inner ends of said leads, providing a metal frame having an opening in the center thereof and a shape substantially identical to the shape of said rim, fusing a transparent pane into said center opening to form an hermetic seal therebetween, placing said frame on said side wall with said transparent pane registering with said space and exposing said circuit to view, preheating the first structure, frame and pane to an intermediate temperature, providing solder and applying heat only to said frame so as to raise the temperature of the frame and side walls to between 200°C and 400°C to solder the frame to the side walls, and maintaining the temperature of the base below a predetermined level while the heat is being applied to the frame so as to maintain the temperatures of said components below a predetermined level.

* * * * *